ns009748459B2

United States Patent
Oh et al.

(10) Patent No.: US 9,748,459 B2
(45) Date of Patent: Aug. 29, 2017

(54) METHOD FOR MANUFACTURING IMPROVED CHIP-ON-BOARD TYPE LIGHT EMITTING DEVICE PACKAGE AND SUCH MANUFACTURED CHIP-ON-BOARD TYPE LIGHT EMITTING DEVICE PACKAGE

(71) Applicant: LUMENS CO., LTD., Yongin-si, Gyeonggi-do (KR)

(72) Inventors: Seung-Hyun Oh, Gwangju-si (KR); Pyoung-Gug Kim, Hwaseong-si (KR); Yun-Geon Cho, Osan-si (KR); Chun-Ki Min, Yongin-si (KR); Chul-Yeun Choi, Yongin-si (KR); Dae-Gil Jung, Osan-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 14/912,366

(22) PCT Filed: Aug. 12, 2014

(86) PCT No.: PCT/KR2014/007463
§ 371 (c)(1),
(2) Date: Feb. 16, 2016

(87) PCT Pub. No.: WO2015/023099
PCT Pub. Date: Feb. 19, 2015

(65) Prior Publication Data
US 2016/0190411 A1  Jun. 30, 2016

(30) Foreign Application Priority Data

Aug. 16, 2013  (KR) .................. 10-2013-0097414

(51) Int. Cl.
*H01L 33/00* (2010.01)
*H01L 21/50* (2006.01)
(Continued)

(52) U.S. Cl.
CPC ............ *H01L 33/62* (2013.01); *H01L 27/156* (2013.01); *H01L 33/486* (2013.01); *H01L 33/52* (2013.01);
(Continued)

(58) Field of Classification Search
CPC ....... H01L 25/075; H01L 27/15; H01L 33/08; H01L 33/00; H01L 33/62; H01L 29/33;
(Continued)

(56) References Cited

U.S. PATENT DOCUMENTS

2009/0289274 A1* 11/2009 Park .................. H01L 33/62
257/99
2010/0002455 A1*  1/2010 Matsuoka ............ H01L 33/642
362/382
(Continued)

FOREIGN PATENT DOCUMENTS

JP       2007-214522      8/2007
KR    10-2012-0022410    3/2012
(Continued)

OTHER PUBLICATIONS

International Search Report mailed Nov. 27, 2014 in PCT/KR2014/007463, 3 pgs.
(Continued)

*Primary Examiner* — Benjamin Sandvik
*Assistant Examiner* — Damon Hillman
(74) *Attorney, Agent, or Firm* — Ichthus International Law, PLLC

(57) ABSTRACT

There are provided a chip-on-board type light emitting device package capable of improving structural reliability and heat-dissipating efficiency and reducing a manufacturing cost, and a method for manufacturing the same. The chip-on-board type light emitting device package includes: a dual frame including a base frame on which a plurality of
(Continued)

light emitting devices are mounted and an electrode frame positioned above the base frame so as to be spaced apart from the base frame and including two electrodes separated from each other; and a molding part coupled to the dual frame so that the base frame and the electrode frame are spaced apart from each other and having an opening through which light generated in the plurality of light emitting devices is to be emitted, wherein the base frame has a through-hole through which the electrode frame is exposed.

11 Claims, 14 Drawing Sheets

(51) Int. Cl.
    *H01L 33/62*         (2010.01)
    *H01L 33/48*         (2010.01)
    *H01L 33/64*         (2010.01)
    *H01L 27/15*         (2006.01)
    *H01L 33/52*         (2010.01)

(52) U.S. Cl.
    CPC .... *H01L 33/64* (2013.01); *H01L 2224/73265* (2013.01); *H01L 2933/005* (2013.01); *H01L 2933/0033* (2013.01); *H01L 2933/0066* (2013.01)

(58) Field of Classification Search
    CPC ....... H01L 33/52; H01L 33/486; H01L 33/64; H01L 27/156
    See application file for complete search history.

(56) References Cited

U.S. PATENT DOCUMENTS

2010/0246135 A1*   9/2010   Hongo .................... H01L 23/12
                                                            361/707
2011/0260303 A1*   10/2011   Pagaila ................... H01L 23/36
                                                            257/660

FOREIGN PATENT DOCUMENTS

| KR | 10-2012-0034998 | 4/2012 |
| KR | 10-2012-0085085 | 7/2012 |
| KR | 10-2013-0022643 | 3/2013 |

OTHER PUBLICATIONS

Office Action in the Chinese Patent Application No. 201480045563.0, dated May 4, 2017, pp. 5.

* cited by examiner

METHOD FOR MANUFACTURING IMPROVED CHIP-ON-BOARD TYPE LIGHT EMITTING DEVICE PACKAGE AND SUCH MANUFACTURED CHIP-ON-BOARD TYPE LIGHT EMITTING DEVICE PACKAGE

CROSS-REFERENCE TO RELATED APPLICATION(S)

This application is a National Stage entry of International Application No. PCT/KR2014/007463, filed on Aug. 12, 2014, claiming priority to Korean Patent Application No. 10-2013-0097414, filed on Aug. 16, 2013, the content of which is incorporated herein by reference in its entirety.

TECHNICAL FIELD

The present invention relates to an electronic apparatus, and more particularly, to a chip-on-board type light emitting device package and a method for manufacturing the same.

BACKGROUND ART

Generally, a light emitting device has been used as a light source of a backlight module in an electronic apparatus, for example, a display apparatus, or has been used as a light source of a lighting equipment. The light emitting device may be packaged in various forms in order to be coupled to a backlight unit or in order to be mounted in the lighting equipment. This light emitting device package or a light emitting apparatus having various optical system coupled thereonto has been studied in order to improve structural reliability and heat-dissipating efficiency and reduce a manufacturing cost. The light emitting device package may be classified into a surface mount device (SMD) type package and a chip-on-board (COB) type package. The chip-on-board type package has a heat transfer path less complicated than that of the surface mount device type package, such that heat-dissipating characteristics may be improved. Therefore, the chip-on-board type package may be applied to a high-output and high-integration light emitting device package.

RELATED ART DOCUMENT

Patent Document (Patent Document 1) Korean Patent Laid-Open Publication No. 10-2012-0034998

DISCLOSURE

Technical Problem

However, in the chip-on-board type light emitting device package according to the related art, heat-dissipating characteristics depending on a high output have still become a problem. Further, a light emitting device package capable of improving heat-dissipating characteristics and reducing a manufacturing cost, and a method for manufacturing the same have been demanded in order to secure market competitiveness. The present invention is to solve several problems including the problem described above, and an object of the present invention is to provide a chip-on-board type light emitting device package capable of improving structural reliability and heat-dissipating efficiency and reducing a manufacturing cost, and a method for manufacturing the same. However, this object is only an example, and the scope of the present invention is not limited thereto.

Technical Solution

According to an aspect of the present invention, there is provided a chip-on-board type light emitting device package. The chip-on-board type light emitting device package includes: a dual frame including a base frame on which a plurality of light emitting devices are mounted and an electrode frame positioned above the base frame so as to be spaced apart from the base frame and including two electrodes separated from each other; and a molding part coupled to the dual frame so that the base frame and the electrode frame are spaced apart from each other and having an opening through which light generated in the plurality of light emitting devices is to be emitted. The base frame has a through-hole through which the electrode frame is exposed.

The molding part may form a side wall of the opening so as to expose a portion of the electrode frame, and may be extended to be filled in an overlapped region between the electrode frame and the base frame.

The molding part may be further extended to cover at least a portion of a side wall of the through-hole.

The molding part may be formed directly below in a region in which a bonding wire electrically connecting the light emitting device and the electrode frame to each other is bonded to the electrode frame.

The base frame may have a first penetration hole penetrating through an inner portion thereof, the first penetration hole being filled with the molding part, such that bonding between the base frame and the molding part is enhanced.

A cross section of the first penetration hole may become wider toward a lower portion of the base frame.

A ruggedness may be formed on a contact portion between an upper surface of the base frame and the molding part, such that bonding between the base frame and the molding part is enhanced.

The electrode frame may have a second penetration hole formed at a position corresponding to the first penetration hole above the first penetration hole, the second penetration hole being filled with the molding part, such that bonding between the electrode frame and the molding part is enhanced.

According to another aspect of the present invention, there is provided a method for manufacturing a chip-on-board type light emitting device package. The method for manufacturing a chip-on-board type light emitting device package includes: providing a base frame structure in which a plurality of base frames on which a plurality of light emitting devices are mounted are connected to each other and are arranged in an array form; providing an electrode frame structure in which a plurality of electrode frames are connected to each other and are arranged in an array form, the electrode frame structure being formed in a down-set structure; providing a dual frame structure by aligning and disposing the electrode frame structure with and on the base frame structure; and forming a molding part coupled to the dual frame structure so that the base frame and the electrode frame are spaced apart from each other and having an opening through which light generated in the plurality of light emitting devices is to be emitted, wherein the base frame has a through-hole through which the electrode frame is exposed.

The forming of the molding part may include inserting a support pin into the through-hole in order to prevent generation of a short-circuit due to a contact between the electrode frame and the base frame.

The providing of the dual frame structure may include inserting guide pins into alignment holes formed in each of the base frame structure and the electrode frame structure.

The providing of the base frame structure may include providing the base frame structure in which the plurality of base frames having first penetration holes penetrating through an inner portion thereof are connected to each other and are arranged in the array form, and the forming of the molding part may include filling the first penetration holes with the molding part in order to enhance bonding between the base frame and the molding part.

The providing of the electrode frame structure may include providing the electrode frame structure in which the plurality of electrode frames having second penetration holes penetrating through an inner portion thereof are connected to each other and are arranged in the array form, and the forming of the molding part may include filling the second penetration holes with the molding part in order to enhance bonding between the electrode frame and the molding part.

Advantageous Effects

According to an exemplary embodiment of the present invention configured as described above, the chip-on-board-type light emitting device package capable of improving structural reliability and heat-dissipating efficiency and reducing a manufacturing cost, and the method for manufacturing the same may be implemented. The scope of the present invention is not limited to the above-mentioned effects.

BEST MODE

Hereinafter, exemplary embodiments of the present invention will be described in detail with reference to the accompanying drawings. However, the present invention is not limited to exemplary embodiments to be disclosed below, but may be implemented in various different forms. These exemplary embodiments will be provided in order to make the disclosure of the present invention complete and allow those skilled in the art to completely understand the scope of the present invention. In addition, sizes of components may be exaggerated or reduced in the accompanying drawings for convenience of explanation.

Terms such as "on" or "beneath (below)" mentioned in a process of explaining the present exemplary embodiment may be used in order to describe a relative relationship between any components and other components as illustrated in the accompanying drawings. That is, it may be understood that these relative terms include other directions separately from directions illustrated in the accompanying drawings. For example, when upper and lower portions of a structure illustrated in the accompanying drawings are overturned, components mentioned to be present on upper surfaces of other components are present on lower surfaces of other components. Therefore, the term "on" mentioned by way of example may include both of directions of "on" and "beneath" depending on specific directions in the accompanying drawings.

In addition, when it is mentioned that any component is positioned "on" another component or is "(electrically) connected" to another component in a process of explaining the present exemplary embodiment, it may mean that any component is positioned directly on another component or is (electrically) connected directly to another component, or one or two or more components are interposed therebetween. However, when it is mentioned that any component is positioned "directly on" another component, is "(electrically) connected directly" to another component, or "contacts directly" another component, it means that components are not interposed therebetween unless separately mentioned.

In the following exemplary embodiments, an x axis, a y axis, and a z axis are not limited to three axes on an orthogonal coordinate system, but may be interpreted as a broad meaning including the three axes. For example, the x axis, the y axis, and the z axis may be orthogonal to each other or may indicate different directions that are not orthogonal to each other.

Figure 1:
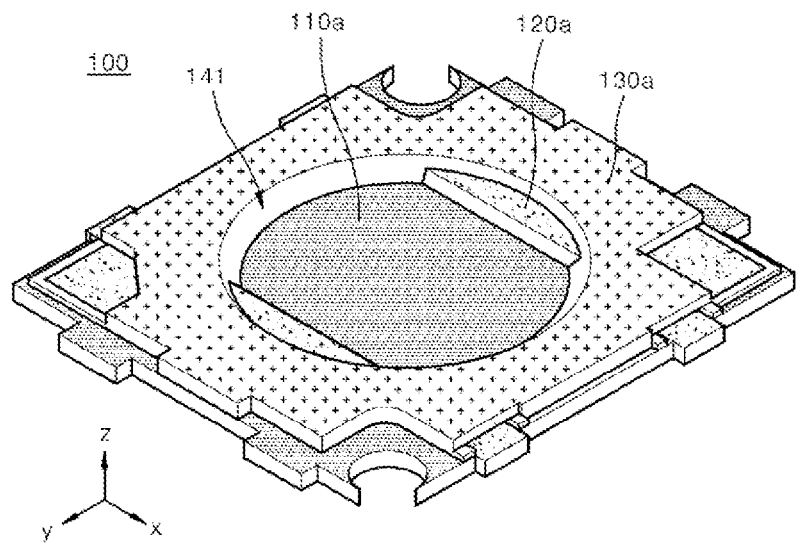
FIG. 1 is a perspective view schematically illustrating a chip-on-board type light emitting device package according to an exemplary embodiment of the present invention.
Figure 2:
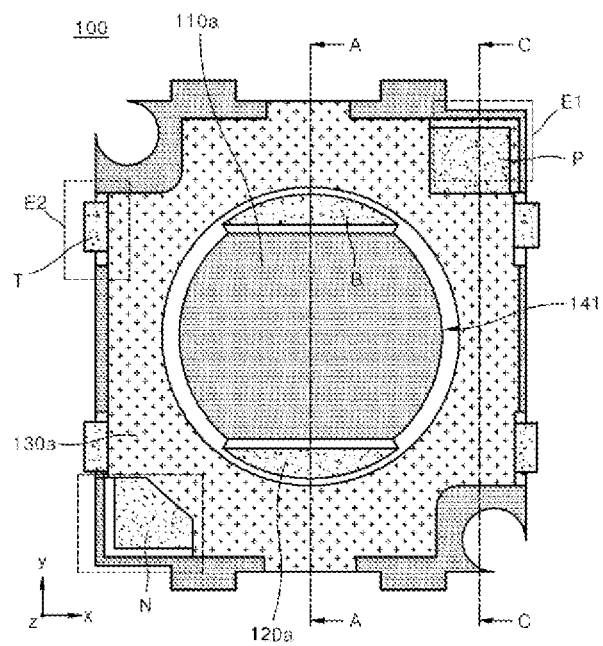
FIG. 2 is a plan view schematically illustrating the chip-on-board type light emitting device package according to an exemplary embodiment of the present invention.
Figure 3A:
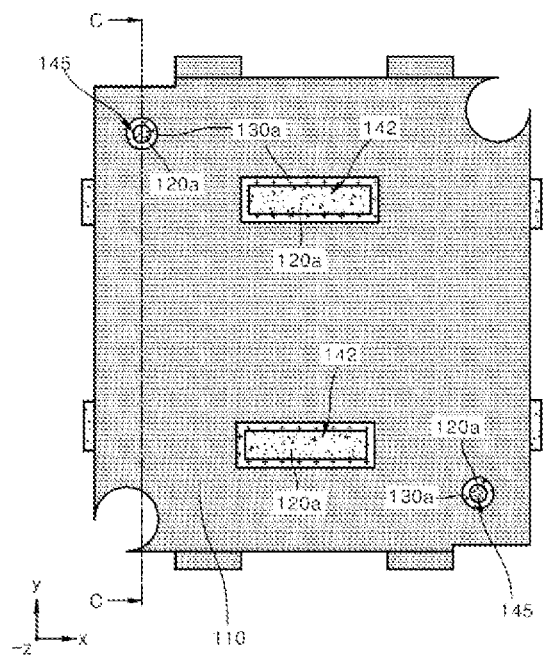
FIG. 3A is a bottom view schematically illustrating the chip-on-board type light emitting device package according to an exemplary embodiment of the present invention.
Figure 4A:
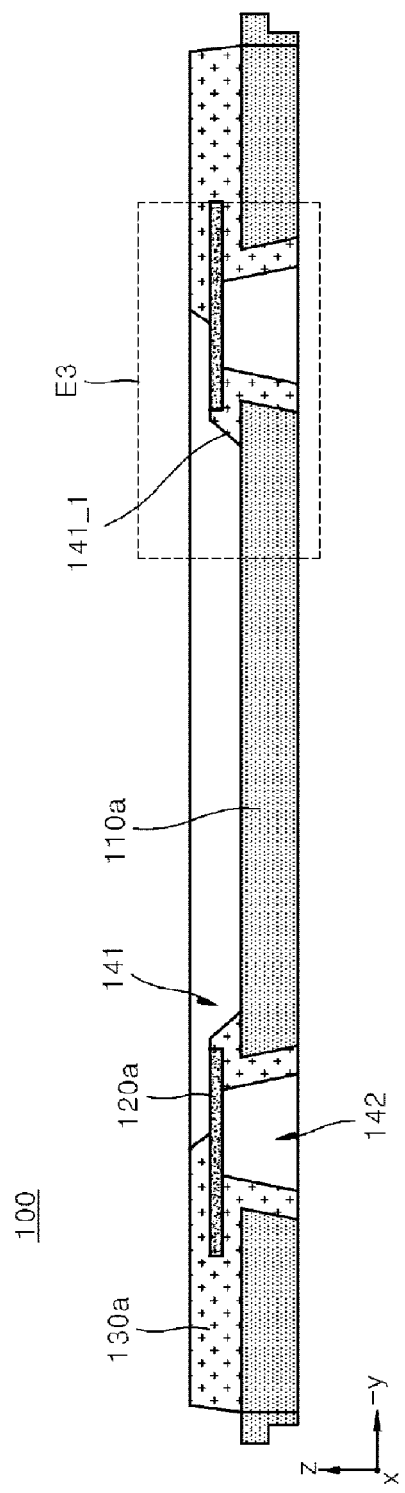
FIG. 4A is a cross-sectional view of the chip-on-board type light emitting device package according to an exemplary embodiment of the present invention taken along line A-A of FIG. 2.

FIG. 1 is a perspective view schematically illustrating a chip-on-board type light emitting device package according to an exemplary embodiment of the present invention, FIG. 2 is a plan view schematically illustrating the chip-on-board type light emitting device package according to an exemplary embodiment of the present invention, FIG. 3A is a bottom view schematically illustrating a chip-on-board type light emitting device package according to an exemplary embodiment of the present invention, and FIG. 4A is a cross-sectional view of the chip-on-board type light emitting device package according to an exemplary embodiment of the present invention taken along line A-A of FIG. 2.

Referring to FIGS. 1, 2, 3A, and 4A, the chip-on-board type light emitting device package 100 according to an exemplary embodiment of the present invention includes a dual frame including a base frame 110a on which a plurality of light emitting devices (not illustrated) may be mounted and an electrode frame 120a positioned above the base frame 110a so as to be spaced apart from the base frame 110a and including two electrodes separated from each other. Further, the chip-on-board type light emitting device package 100 includes a molding part 130a coupled to the dual frame so that the base frame 110a and the electrode frame 120a are spaced apart from each other and having an opening 141 through which light generated in the plurality of light emitting devices is to be emitted.

The base frame 110a may have the plurality of light emitting devices mounted on an upper surface thereof exposed by the opening 141 so as to contact the upper surface, and may dissipate heat generated from the plurality of light emitting devices to the outside. In the chip-on-board type light emitting device package 100, the base frame 110a may be in charge of a function of a board on which the light emitting devices may be mounted and a function of a heat sink. The base frame 110a may contain a metal having excellent heat transfer characteristics and heat-dissipating characteristics, for example, a metal such as aluminum, copper, or an alloy thereof.

The electrode frame 120a may contain a metal having conductivity, for example, a metal such as copper, aluminum, gold, silver, palladium, or an alloy thereof. Any one of the two electrodes separated from each other in the electrode frame 120a may correspond to a positive electrode P (see FIG. 2), and the other of the two electrodes may correspond to a negative electrode N (see FIG. 2). The two electrodes separated from each other in the electrode frame 120a may be variously called input and output pads, electrode pads, chip pads, die pads, package electrodes, board electrodes, and the like.

The plurality of light emitting devices may be disposed within the opening 141 defined by the molding part 130a, the electrode frame 120a, and the base frame 110a, and may be electrically connected to each other by electrical connection members such as bonding wires. In addition, the plurality of light emitting devices may be electrically connected to a predetermined region (for example, region B of FIG. 2) of the electrode frame 120a by electrical connection members. Therefore, the plurality of light emitting devices may receive power from a power supply (not illustrated) to emit light. In an exemplary embodiment, a direction in which light is emitted from the light emitting devices may be an upward direction (+z direction) that becomes distant from the chip-on-board type light emitting device package 100. The light emitting device, which is a device receiving an electrical signal applied thereto to emit the light, may be used as a light source of various electronic apparatuses or lighting apparatuses, and may be, for example, a light emitting diode (LED) chip, and may be a planar LED, a vertical LED, or the like. However, these light emitting devices are only an example, and the technical spirit of the present invention is not limited thereto. The plurality of light emitting devices may be arranged in various forms, and may also be grouped into a plurality of groups. The light emitting devices grouped and classified may receive driving voltages/currents independently of each other. Therefore, the light emitting devices may be driven independently of each other. The number, layouts, grouping, electrical connection relationships, driving schemes, and the like, of light emitting devices may be variously modified.

Figure 7:
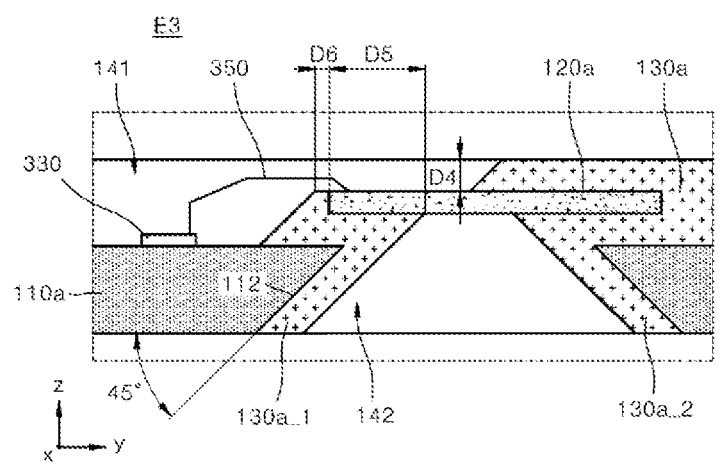
FIG. 7 is an enlarged cross-sectional view of part E3 of FIG. 4A.

Also referring to FIG. 7, which is an enlarged cross-sectional view of part E3 of FIG. 4A, in the chip-on-board type light emitting device package 100 according to an exemplary embodiment of the present invention, the electrode frame 120a may be electrically insulated from the base frame 110a. To this end, the electrode frame 120a is positioned above the base frame 110a so as to be spaced apart from the base frame 110a, and the molding part 130a may be interposed between the electrode frame 120a and the base frame 110a in order to maintain a spaced distance between the electrode frame 120a and the base frame 110a. For example, the molding part 130a may form a side wall 141_1 of the opening 141 so as to expose a portion (for example, region B of FIG. 2) of the electrode frame 120a, and may be extended to be filled in at least a portion of an overlapped region between the electrode frame 120a and the base frame 110a. In addition, the molding part 130a may be further extended to cover at least a portion of a side wall 112 of a through-hole 142.

Meanwhile, the molding part 130a may also be formed directly below in a region D5 (see FIG. 7) in which an electrical connection member 350 such as a bonding wire electrically connecting at least any one 330 of the plurality of light emitting devices and the electrode frame 120a to each other is bonded to the electrode frame 120a. Through this configuration, a bouncing phenomenon in a process of bonding the bonding wire 350 may be prevented. When only a molding part 130a_2 illustrated at the right of the electrode frame 120a illustrated in FIG. 7 is present without a molding part 130a_1 illustrated at the left of the electrode frame 120, the bouncing phenomenon may occur in the process of bonding the bonding wire 350 to the electrode frame 120a. In order to prevent the bouncing phenomenon, a portion directly below the region D5 having a length of about 800 μm may be supported by the molding part 130a.

Referring to FIGS. 1 and 2, although the molding part 130a is formed to cover a portion of the electrode frame 120a when viewing the chip-on-board type light emitting diode package 100 according to an exemplary embodiment of the present invention from the top, the remaining portion of the electrode frame 120a exposed without being covered by the molding part 130a is present. The exposed remaining portion of the electrode frame 120a may be classified into various regions, which may include, for example, a bonding region B that may be electrically connected to at least any one 330 (see FIG. 7) of the plurality of light emitting devices by the bonding wire 350 (see FIG. 7), pad regions P and N for electrical connection to the outside of the chip-on-board type light emitting device package 100, a tie bar region T remaining after trimming, and the like. The above-mentioned pad regions P and N may configure a positive electrode pad P and a negative electrode pad N separated from each other. Positions of a positive electrode and a negative electrode may be exchanged with each other by a circuit configuration.

The molding part 130a may be formed using a mold, and may be formed of a resin through, for example, a transfer molding method, or the like. The molding part 130a is not limited to being formed by the transfer molding method, but may be variously modified. For example, the molding part 130a may also be formed by an injection-molding method, or the like. An example of the resin that may be used as a material of the molding part 130a may include epoxy, or the like. The present inventors suggest various configurations as described below in order to solve various problems that may occur in a process of forming the molding part 130a while maintaining a state in which the base frame 110a and the electrode frame 120a are spaced apart from each other.

Referring to FIGS. 4A and 7, the base frame 110a has the through-hole 142 through which the electrode frame 120a is exposed. That is, the base frame 110a has the through-hole 142 through which a portion of the electrode frame 120a is exposed when viewed in the +z direction. The through-hole 142 may include a space into which a support pin 242 (see FIG. 12) disclosed in a method for manufacturing a chip-on-board type light emitting device package to be described below may be inserted. The support pin 242 may be introduced in order to prevent a phenomenon that the electrode frame 120a is pressed and bent by the mold in a process of injection-molding the molding part 130a coupled to the dual frame so that the base frame 110a and the electrode frame 120a are spaced apart from each other, such that the base frame 110a and the electrode frame 120a contact each other and are short-circuited. In addition, the support pin 242 may be introduced in order to support the bonding region B of the electrode frame 120a in a wire bonding process to secure bondability. In addition, the support pin 242 may be introduced in order to prevent a flash phenomenon that the resin is undesirably leaked during forming the molding part 130a from being generated in the bonding region B.

Figure 5:
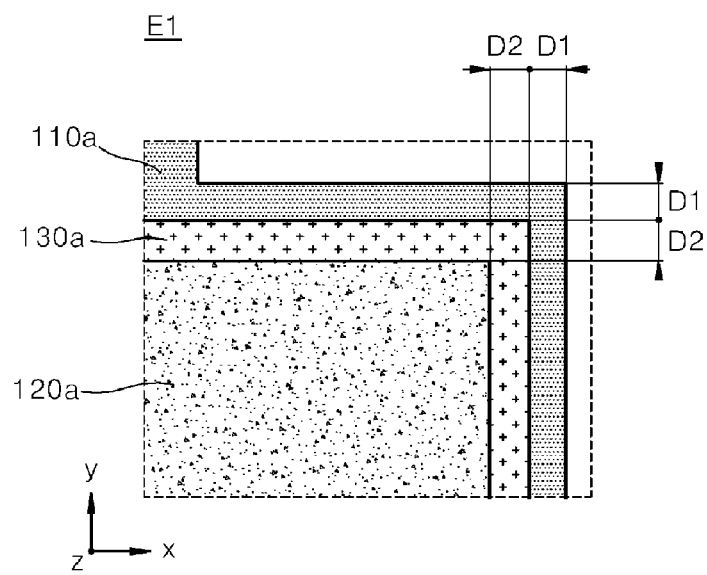
FIG. 5 is an enlarged view of part E1 of FIG. 2.

Meanwhile, also referring to FIG. 5, which is an enlarged view of part E1 of FIG. 2 including the above-mentioned pad regions P and N, a predetermined offset distance D1 of, for example, about 400 μm from the base frame 110a is set, thereby making it possible to prevent the flash phenomenon in the base frame 110a during forming the molding part 130a. In addition, a predetermined distance D2 of, for example, about 600 μm is secured at an outer side of the electrode frame 120a, thereby making it possible to secure moldability during forming the molding part 130a.

Figure 6:
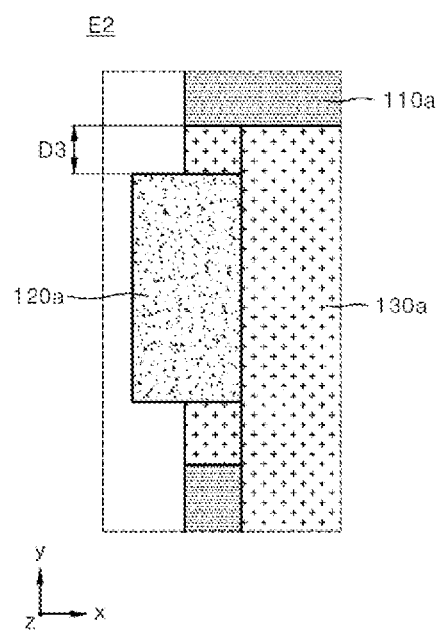
FIG. 6 is an enlarged view of part E2 of FIG. 2.

Meanwhile, also referring to FIG. 6, which is an enlarged view of part E2 of FIG. 2 including the tie bar region T remaining after the above-mentioned trimming, a predetermined distance D3 of, for example, about 800 μm to 1000 μm is secured in the tie bar region of the electrode frame 120a, thereby making it possible to secure moldability of a process of forming the molding part 130a.

Meanwhile, referring to FIG. 7, in order to prevent problems that the molding part 130a is broken or is not molded in the process of forming the molding part 130a, an upper surface of the molding part 130a and an upper surface of the electrode frame 120a may be configured to have the same level in a predetermined section D6 of, for example, about 150 μm, and a side surface of the through hole 142 in the base frame 110a may be configured to have an inclined angle of, for example, about 45 degrees.

Meanwhile, the present inventors suggest various configurations as described below in order to enhance bonding between the base frame 110a and/or the electrode frame 120a and the molding part 130a in the process of forming the molding part 130a while maintaining the state in which the base frame 110a and the electrode frame 120a are spaced apart from each other.

Figure 3B:
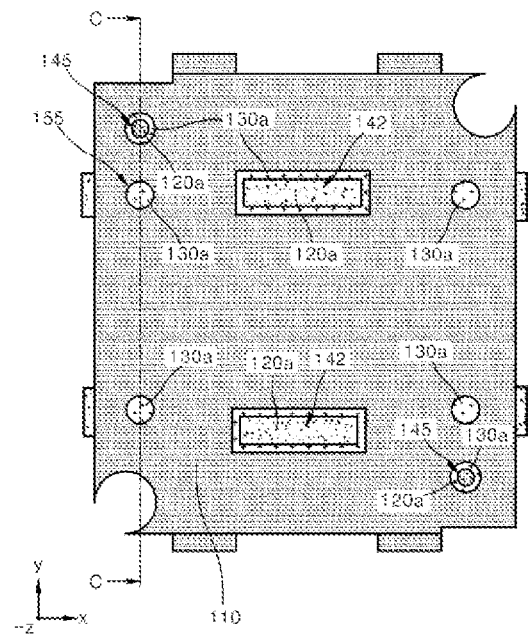
FIG. 3B is a bottom view schematically illustrating a chip-on-board type light emitting device package according to another exemplary embodiment of the present invention.
Figure 4B:
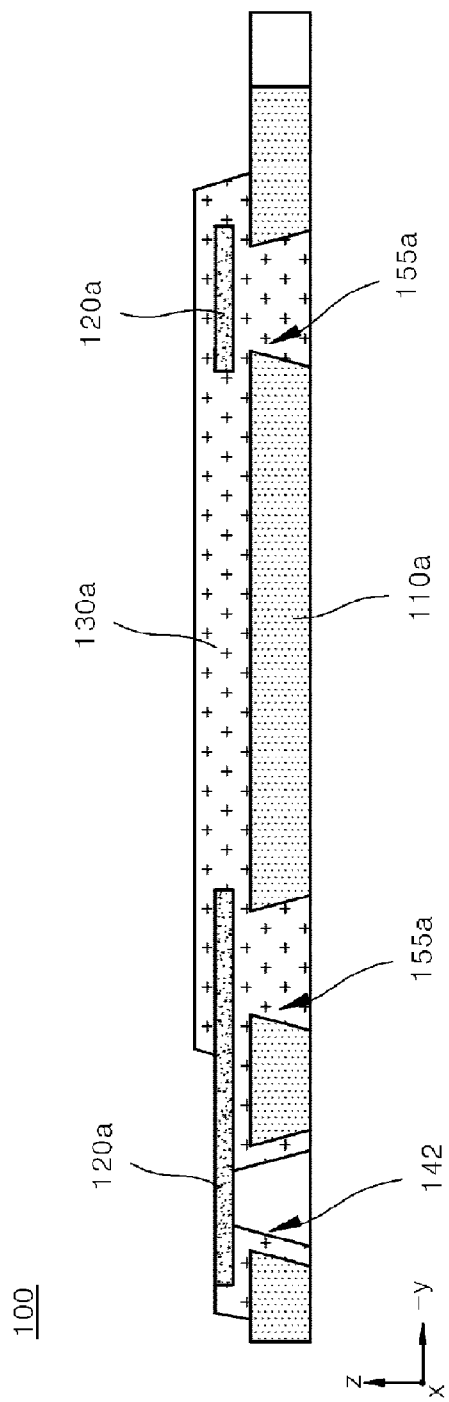
FIG. 4B is a cross-sectional view of a chip-on-board type light emitting device package according to another exemplary embodiment of the present invention taken along line C-C of FIG. 2.

FIG. 3B is a bottom view schematically illustrating a chip-on-board type light emitting device package according to another exemplary embodiment of the present invention, and FIG. 4B is a cross-sectional view of a chip-on-board type light emitting device package according to another exemplary embodiment of the present invention taken along line C-C of FIG. 2.

Referring to FIGS. 1, 2, 3B, and 4B, the base frame 110a has a first penetration hole 155a penetrating through an inner portion thereof, wherein the first penetration hole 155a is filled with the molding part 130a, such that bonding between the base frame 110a and the molding part 130a may be enhanced. Further, the first penetration hole 155a is filled with the molding part 130a, such that bonding between the electrode frame 120a and the molding part 130a may also be enhanced. That is, a penetration hole 155 for enhancing the bonding between the base frame 110a and/or the electrode frame 120a and the molding part 130a may include the first penetration hole 155a penetrating through the inner portion of the base frame 110a, wherein the first penetration hole 155a is filled with the molding part 130a, such that the bonding may be enhanced.

Meanwhile, a cross section of the first penetration hole 155a may be configured to become wider toward a lower portion of the base frame 110a (toward a −z direction), Therefore, a process of forming the molding part 130a may be easy, and the bonding between the base frame 110a and the molding part 130a may be further enhanced. In addition, although the case in which the cross section of the first penetration hole 155a has a circular shape has been illustrated by way of example in the accompanying drawing, the technical spirit of the present invention is not limited thereto. For example, the cross section of the first penetration hole 155a may have a polygonal shape, an oval shape, or any atypical shape. In addition, in order to further enhance the bonding between the base frame 110a and the molding part 130a, the cross section of the first penetration hole 155a may have a toothed wheel shape, which is to implement an increase in a bonding area between the base frame 110a and the molding part 130a and a coupled form in which the base frame 110a and the molding part 130a are engaged with each other.

Figure 4C:
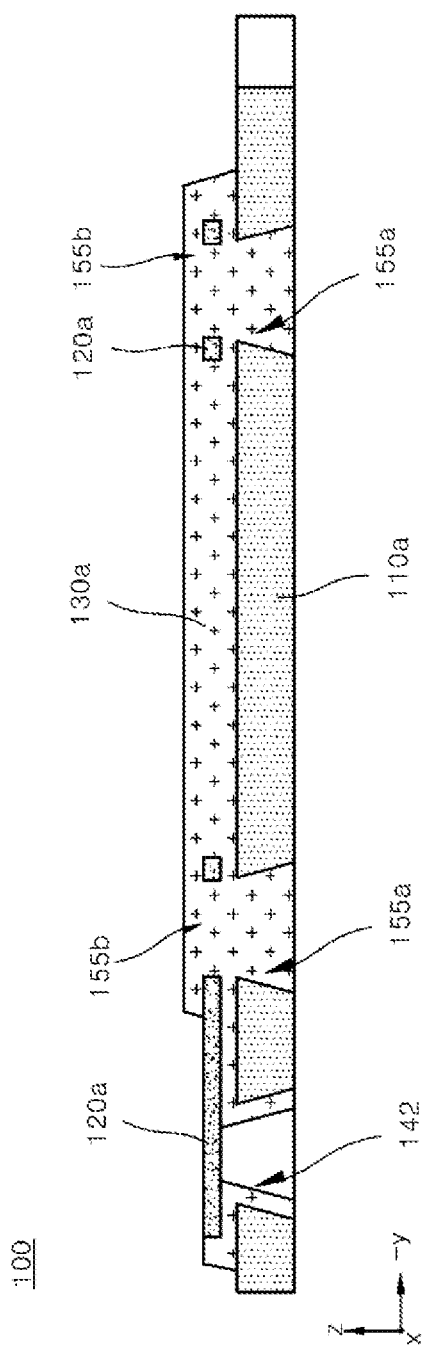
FIG. 4C is a cross-sectional view of a chip-on-board type light emitting device package according to another modified exemplary embodiment of the present invention taken along line C-C FIG. 2.

FIG. 4C is a cross-sectional view of a chip-on-board type light emitting device package according to another modified exemplary embodiment of the present invention taken along line C-C of FIG. 2.

Referring to FIGS. 1, 2, 3B, and 4C, the electrode frame 120a has a second penetration hole 155b formed at a position corresponding to the first penetration hole 155a above the first penetration hole 155a, wherein the second penetration hole 155b is filled with the molding part 130a, such that bonding between the electrode frame 120a and the molding part 130a may be enhanced. Further, the first penetration hole 155a is filled with the molding part 130a, such that bonding between the base frame 110a and the molding part 130a may also be enhanced. That is, a penetration hole 155 for enhancing the bonding between the base frame 110a and/or the electrode frame 120a and the molding part 130a may include the first penetration hole 155a penetrating through the inner portion of the base frame 110a and the second penetration hole 155b penetrating through the inner portion of the electrode frame 120a, wherein the first penetration hole 155a and the second penetration hole 155b are filled with the molding part 130a, such that the bonding may be enhanced. Meanwhile, a shape of the second penetration hole 155b may also be variously modified depending on the shape of the first penetration hole 155a as described above with reference to FIG. 4B.

In the present exemplary embodiment, the second penetration hole 155b is disposed at the position corresponding to the first penetration hole 155a directly above the first penetration hole 155a, such that a resin pillar may penetrate through the first penetration hole 155a and the second penetration hole 155b. The resin pillar may configure a portion of the molding part 130a, and may have, for example, a conical shape. However, in a modified example of the present exemplary embodiment, the second penetration hole 155b is not disposed directly above the first penetration hole 155a, but may also be disposed to be misaligned with the first penetration hole 155a. According to this modified example, since a structure in which the molding part 130a is coupled to the first penetration hole 155a and the second penetration hole 155b is formed in a multi-stage, coupling strength may be further improved.

Figure 4D:
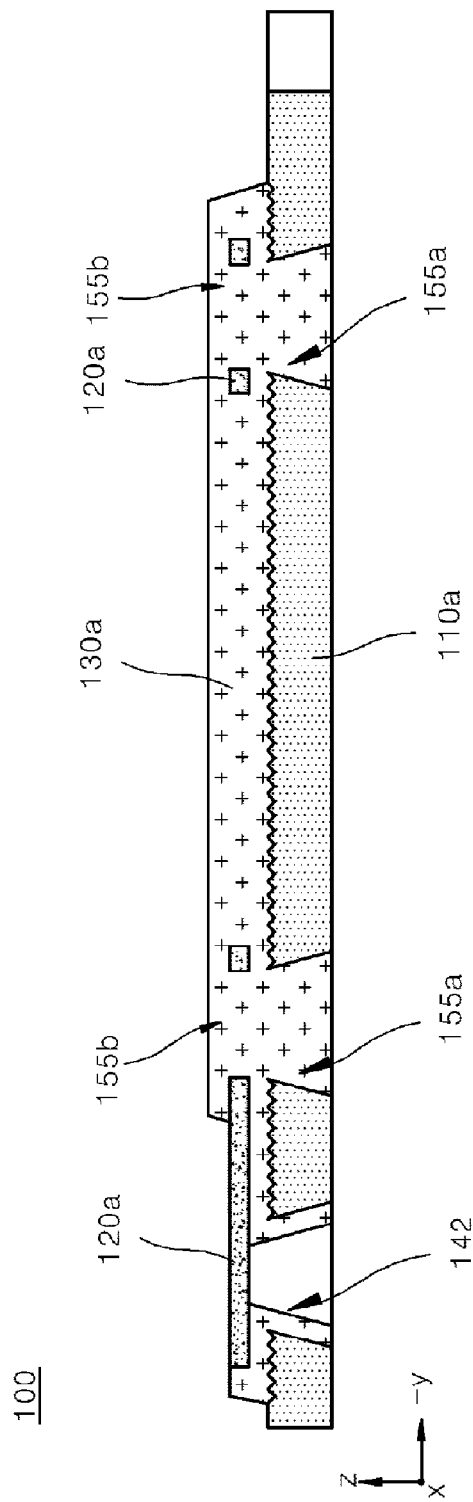
FIG. 4D is a cross-sectional view of a chip-on-board type light emitting device package according to still another modified exemplary embodiment of the present invention taken along line C-C of FIG. 2.

FIG. 4D is a cross-sectional view of a chip-on-board type light emitting device package according to another modified exemplary embodiment of the present invention taken along line C-C of FIG. 2.

Referring to FIGS. 1, 2, 3B, and 4D, a ruggedness is formed on a contact portion between an upper surface of the base frame 110a and the molding part 130a, such that bonding between the base frame 110a and the molding part 130a may be enhanced. Meanwhile, referring to FIG. 4D, a configuration in which the ruggedness is formed on the contact portion between the upper surface of the base frame 110a and the molding part 130a may be applied to the case in which the base frame 110a has the first penetration hole 155a and the electrode frame 120a has the second penetration hole 155b (see FIG. 4C) by way of example. However, the configuration in which the ruggedness is formed on the contact portion between the upper surface of the base frame 110a and the molding part 130a may also be applied to the case in which only the base frame 110a has the first penetration hole 155a (see FIG. 4B) or the penetration hole 155 is not formed at all (see FIG. 4A).

Figure 8A:
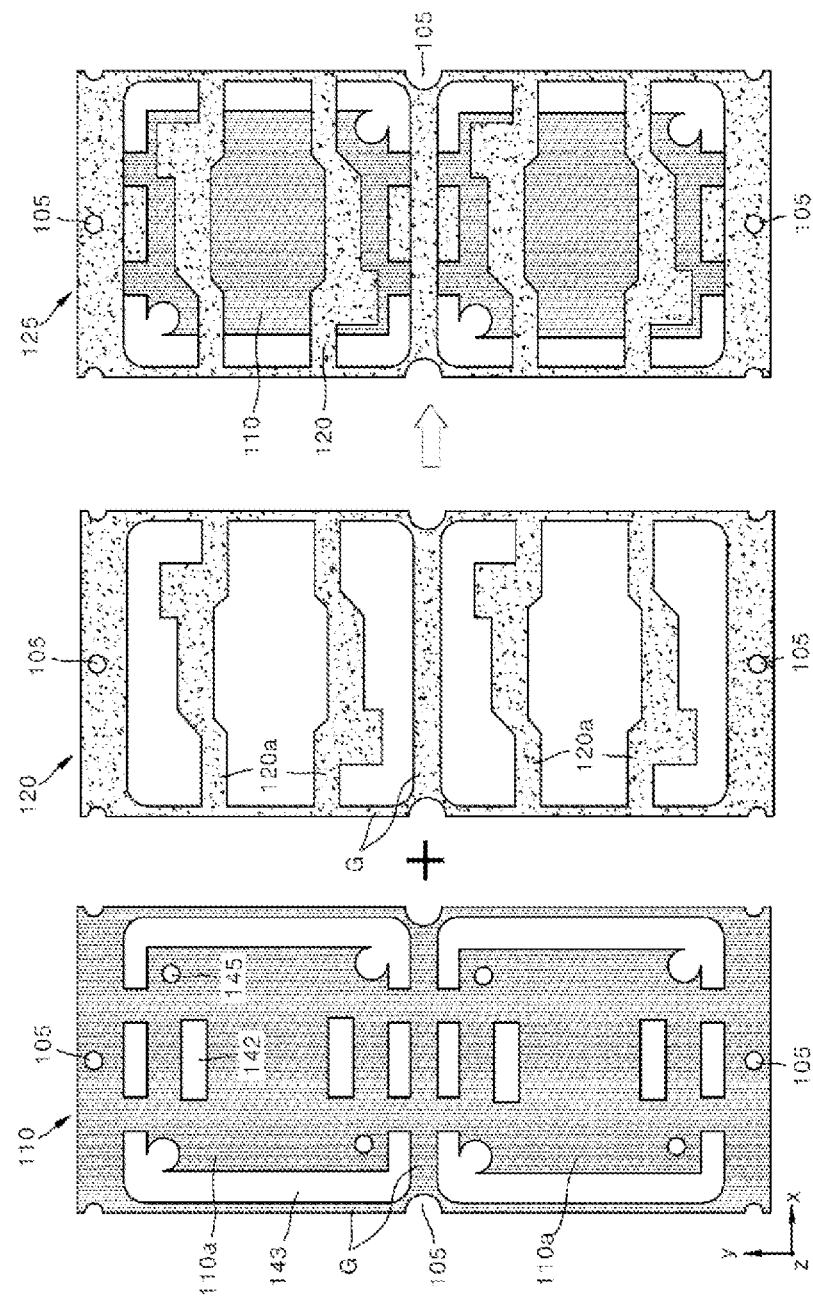
FIG. 8A is a view illustrating a process of providing a dual frame structure in a method for manufacturing a chip-on-board type light emitting device package according to an exemplary embodiment of the present invention.

Hereinafter, a method for manufacturing a chip-on-board type light emitting device package according to an exemplary embodiment of the present invention will be described. FIG. 8A is a view illustrating a process of providing a dual frame structure in a method for manufacturing a chip-on-board type light emitting device package according to an exemplary embodiment of the present invention.

Referring to FIG. 8A, the method for manufacturing a chip-on-board type light emitting device package according to an exemplary embodiment of the present invention includes providing a base frame structure 110 in which a plurality of base frames 110a on which a plurality of light emitting devices (not illustrated) may be mounted are connected to each other and are arranged in an array form; providing an electrode frame structure 120 in which a plurality of electrode frames 120a are connected to each other and are arranged in an array form, the electrode frame structure 120 being formed in a down-set structure; and providing a dual frame structure 125 by aligning and disposing the electrode frame structure 120 with and on the base frame structure 110.

Although the case in which the base frame structure 110 in which two base frames 110a are connected to each other and are arranged in a 2×1 array form and the electrode frame structure 120 in which two electrode frames 120a are connected to each other and are arranged in a 2×1 array form are provided has been illustrated for convenience in FIG. 8A, the technical spirit of the present invention is not limited to the numbers and arranged forms of base frames 110a and electrode frames 120a. For example, the base frame structure 110 or the electrode frame structure 120 may be configured so that a plurality of base frames 110a or a plurality of electrode frames 120a are connected to each other and are arranged in an m×n array form (here, m and n are any positive integer numbers), respectively.

The base frame structure 110 and the electrode frame structure 120 may include guide rails G configuring boundaries at which the plurality of base frames 110a and the plurality of electrode frames 120a are connected to each other, respectively. That is, the guide rails G in the base frame structure 110 and the electrode frame structure 120 may be configured to enclose edges of the base frames 110a and the electrode frames 120a, respectively.

Figure 11:
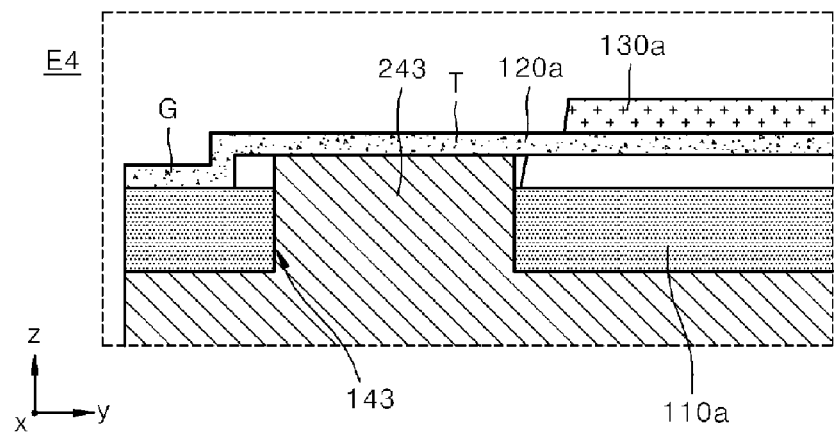
FIG. 11 is a cross-sectional view illustrating a form in which a support pin is inserted in part E4 of FIG. 9.

Meanwhile, the electrode frame structure 120 may be formed in the down-set structure in which the guide rail G and the electrode frame 120a form a step therebetween (see FIG. 11). Therefore, in the dual frame structure 125 configured of the base frame structure 110 and the electrode frame structure 120, the base frame structure 110 and the electrode frame structure 120 contact each other in only guide rail (G) regions, and the base frame 110a and the electrode frame 120a are spaced apart from each other.

Alignment holes 105 are formed at predetermined positions of the base frame structure 110 and the electrode frame structure 120, respectively. For example, the alignment holes 105 may be formed in the guide rail (G) regions of the base frame structure 110 and the electrode frame structure 120. In a process of forming the dual frame structure 125, guide pins are inserted into the alignment holes 105, respectively, in a state in which the base frame structure 110 and the electrode frame structure 120 are overlapped with each other, thereby making it possible to prevent misalignment between the base frame structure 110 and the electrode frame structure 120.

Meanwhile, the base frame 110a includes a plurality of through-holes 142, 143, and 145 so that portions of the electrode frame 120a disposed on the base frame 110a may be exposed, when viewed in the +z direction from the bottom surface of the dual frame structure 125.

Figure 9:
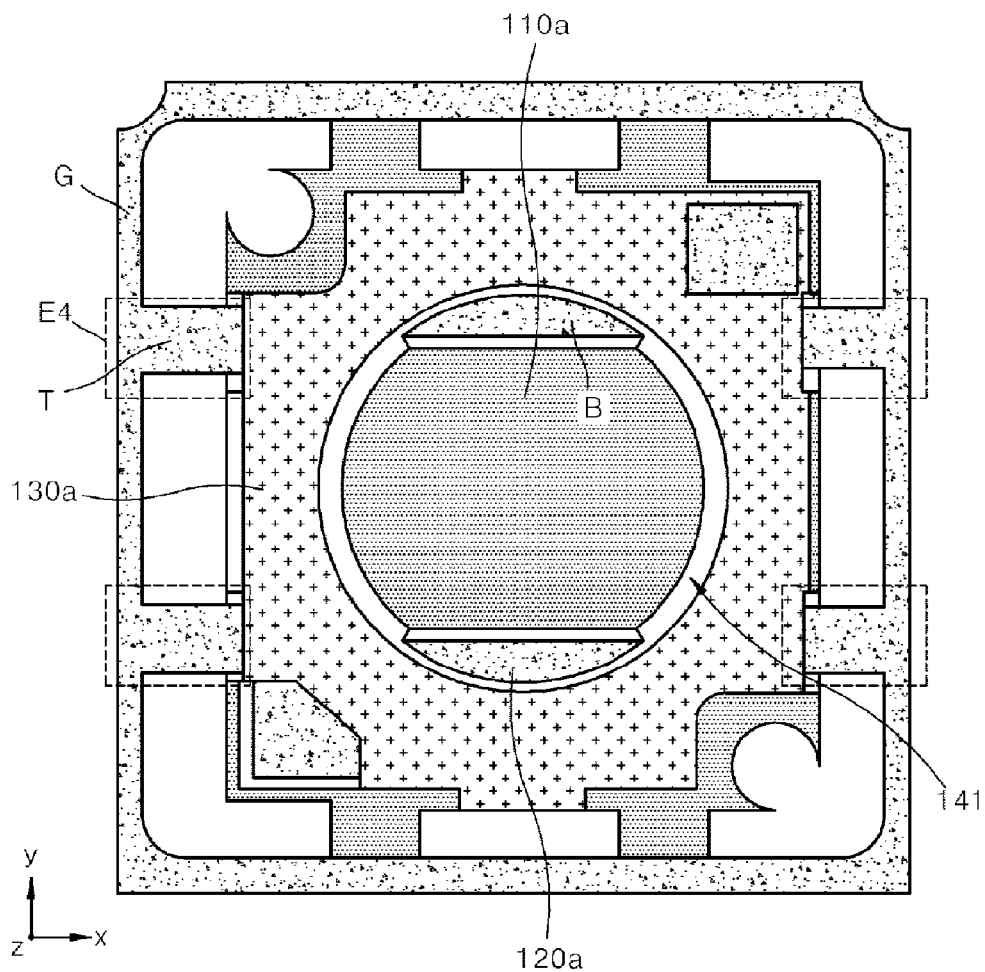
FIG. 9 is a plan view illustrating a portion of a dual frame structure in which a molding part is formed in the method for manufacturing a chip-on-board type light emitting device package according to an exemplary embodiment of the present invention.
Figure 10A:
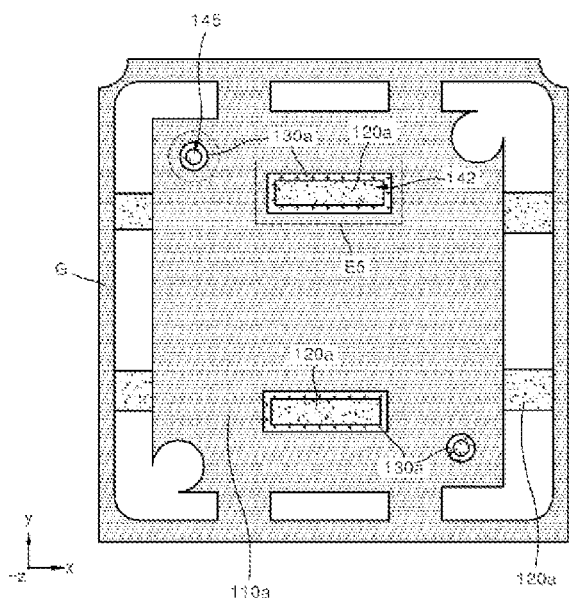
FIG. 10A is a bottom view illustrating a portion of the dual frame structure in which the molding part is formed in the method for manufacturing a chip-on-board type light emitting device package according to an exemplary embodiment of the present invention.

FIG. 9 is a plan view illustrating a portion of a dual frame structure in which a molding part is formed in the method for manufacturing a chip-on-board type light emitting device package according to an exemplary embodiment of the present invention, and FIG. 10A is a bottom view illustrating a portion of the dual frame structure in which the molding part is formed in the method for manufacturing a chip-on-board type light emitting device package according to an exemplary embodiment of the present invention.

Next, referring to FIGS. 9 and 10A, after the providing of the dual frame structure 125, the molding part 130a is formed to be coupled to the dual frame structure 125 so that the base frame 110a and the electrode frame 120a are spaced apart from each other. A structure illustrated in FIGS. 9 and 10A is a unit structure configuring the dual frame structure 125 in which the molding part 130a is formed. That is, a plurality of unit structures are connected to each other and are arranged in an array form, thereby making it possible to configure the dual frame structure 125. The chip-on-board type light emitting device package 100 illustrated in FIGS. 1 to 4A may be implemented by trimming a tie bar (T) portion in the unit structure to separate a guide rail (G) portion.

The molding part 130a may be formed of a resin through a transfer molding method, or the like, using an upper mold and a lower mold. The molding part 130a is not limited to being formed by the transfer molding method, but may be variously modified. For example, the molding part 130a may also be formed by an injection-molding method, or the like. An example of the resin that may be used as a material of the molding part 130a may include epoxy, or the like. The molding part 130a may form a side wall of the opening 141 so as to expose a portion of the electrode frame 120a, and may be formed to be filled in at least a portion of an overlapped region between the electrode frame 120a and the base frame 110a. In addition, the molding part 130a may be further formed to cover at least a portion of a side wall of the through-hole 142. Since the molding part 130a has been described above with reference to FIGS. 1 to 7, a detailed description therefor will be omitted.

The electrode frame 120a may be pressed and bent by the mold during forming the molding part 130a while maintaining the state in which the base frame 110a and the electrode frame 120a are spaced apart from each other. Therefore, the base frame 110a and the electrode frame 120a are not spaced apart from each other, but may contact each other to thereby be short-circuited.

Figure 12:
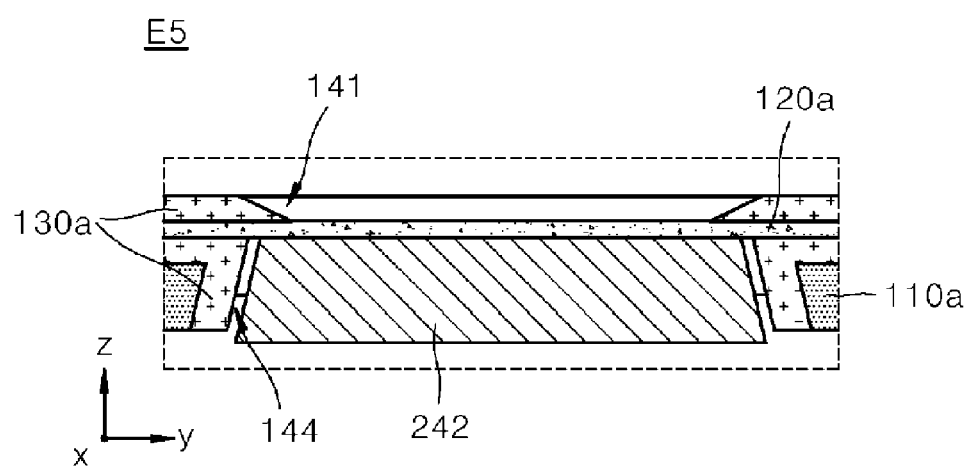
FIG. 12 is a cross-sectional view illustrating a form in which a support pin is inserted in part E5 of FIG. 10A.
Figure 13:
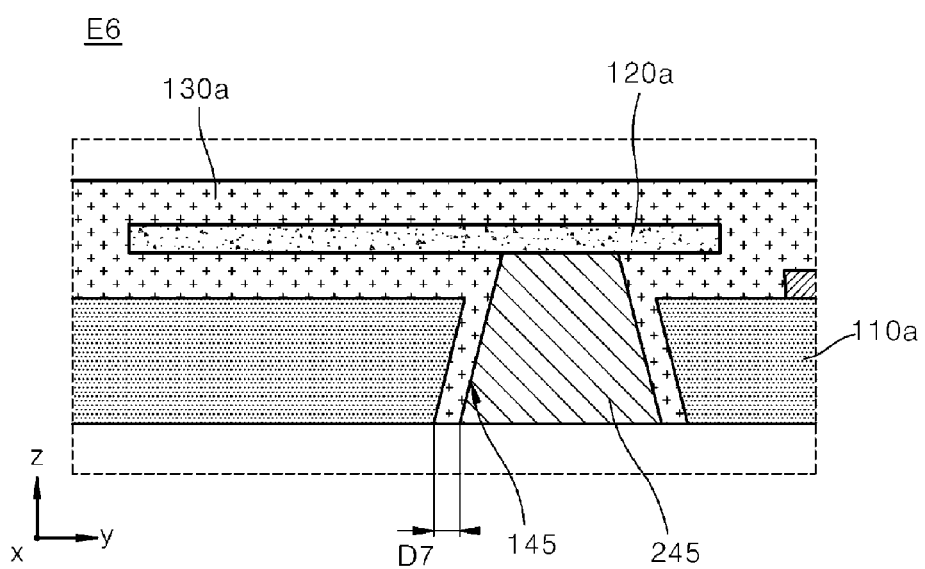
FIG. 13 is a cross-sectional view illustrating a form in which a support pin is inserted in part E6 of FIG. 10A.

Referring to FIGS. 11 to 13, in order to solve this problem, the molding part 130a is formed on the dual frame structure 125 after support pins 242, 243, and 245 are inserted through the plurality of through-holes 142, 143, and 145 formed in the base frame 110a, thereby making it possible to prevent a phenomenon that the electrode frame 120a is pressed and bent by the upper mold and the base frame 110a and the electrode frame 120a contact each other. In detail, FIG. 11 is a cross-sectional view illustrating a form in which a support pin is inserted into the through-hole 143 illustrated in part E4 of FIG. 9, FIG. 12 is a cross-sectional view illustrating a form in which a support pin is inserted into the through-hole 142 illustrated in part E5 of FIG. 10A, and FIG. 13 is a cross-sectional view illustrating a form in which a support pin is inserted into the through-hole 145 illustrated in part E6 of FIG. 10A.

Figure 8B:
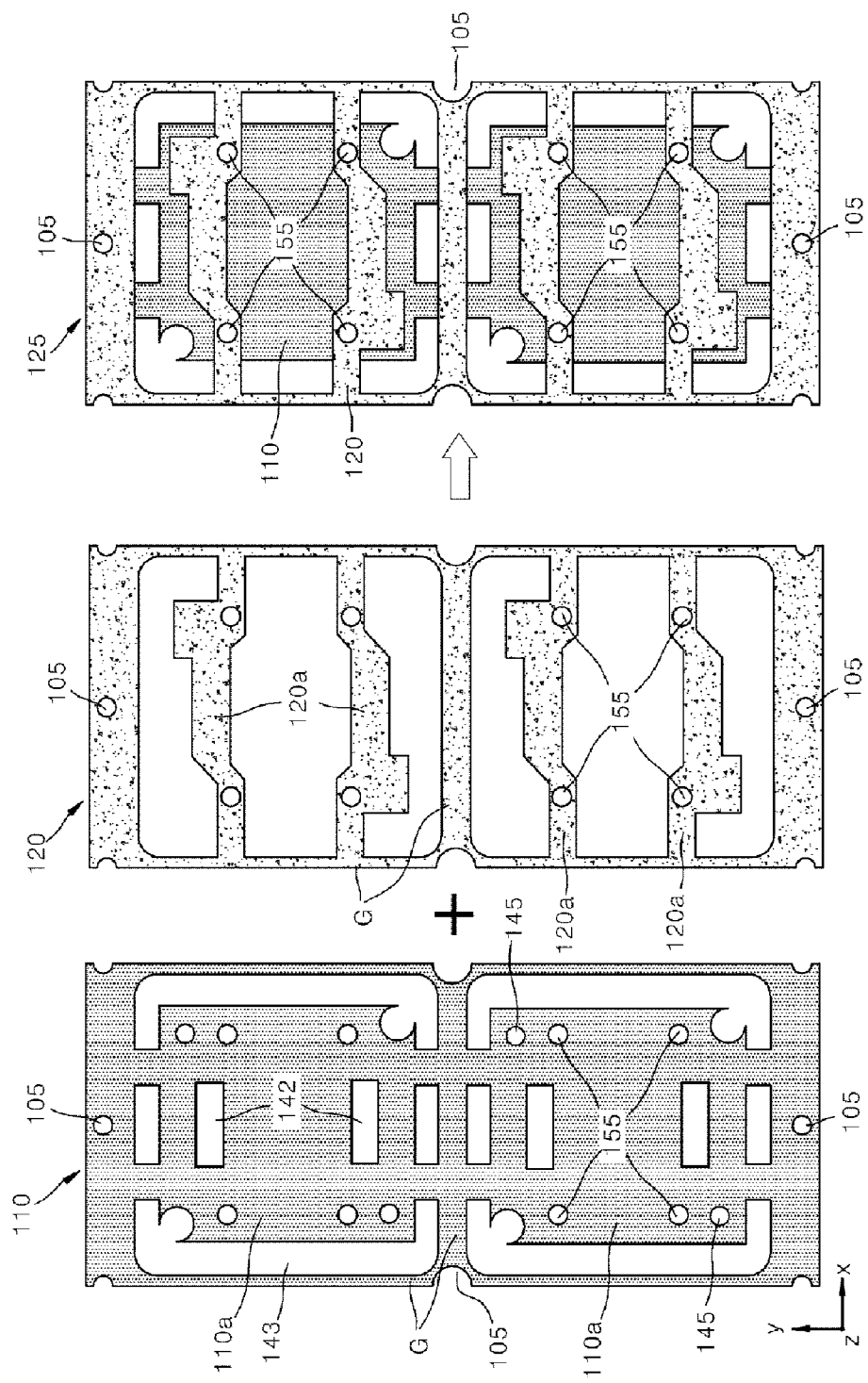
FIG. 8B is a view illustrating a process of providing a dual frame structure in a method for manufacturing a chip-on-board type light emitting device package according to another exemplary embodiment of the present invention.
Figure 10B:
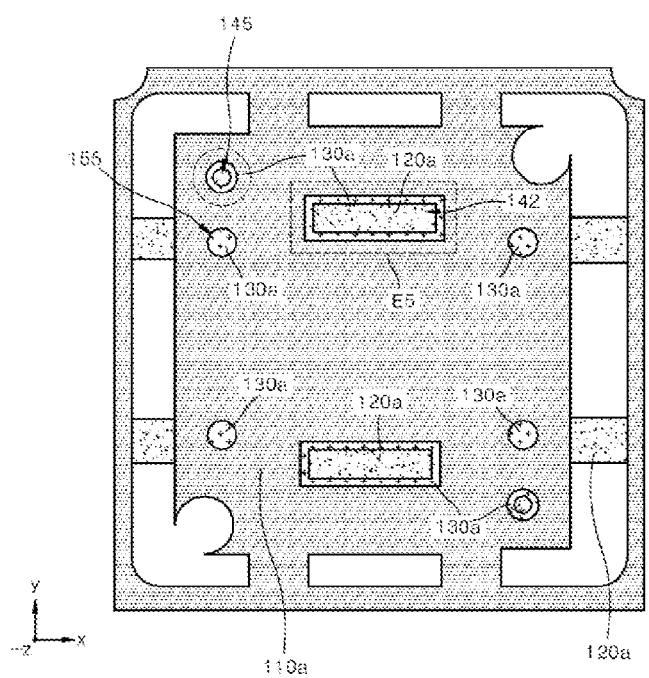
FIG. 10B is a bottom view illustrating a portion of the dual frame structure in which the molding part is formed in the method for manufacturing a chip-on-board type light emitting device package according to another exemplary embodiment of the present invention.

Hereinafter, a method for manufacturing a chip-on-board type light emitting device package according to another exemplary embodiment of the present invention will be described. FIG. 8B is a view illustrating a process of providing a dual frame structure in a method for manufacturing a chip-on-board type light emitting device package according to another exemplary embodiment of the present invention, and FIG. 10B is a bottom view illustrating a portion of the dual frame structure in which the molding part is formed in the method for manufacturing a chip-on-board type light emitting device package according to another exemplary embodiment of the present invention. In FIGS. 8B and 10B, which are modified exemplary embodiments of FIGS. 8A and 10A, the first penetration hole 155a and the second penetration hole 155b are introduced in order to enhance the bonding between the base frame 110a and the electrode frame 120a and the molding part 130a. Therefore, since components other than the first penetration hole and the second penetration hole are the same as the components described above, a description therefor will be omitted.

Referring to FIGS. 8B, 9, and 10B, the method for manufacturing a chip-on-board type light emitting device package according to another exemplary embodiment of the present invention includes providing a base frame structure 110 in which a plurality of base frames 110a on which a plurality of light emitting devices (not illustrated) may be mounted are connected to each other and are arranged in an array form; providing an electrode frame structure 120 in which a plurality of electrode frames 120a are connected to each other and are arranged in an array form, the electrode frame structure 120 being formed in a down-set structure; and providing a dual frame structure 125 by aligning and disposing the electrode frame structure 120 with and on the base frame structure 110.

For example, the providing of the base frame structure 110 may include providing the base frame structure 110 in which the plurality of base frames 110a having the first penetration holes 155a penetrating through an inner portion thereof are connected to each other and are arranged in the array form, and forming of the molding part 130a may include filling the first penetration holes 155a with the molding part 130a in order to enhance the bonding between the base frame 110a and the molding part 130a.

In addition, for example, the providing of the electrode frame structure 120 may include providing the electrode frame structure 120 in which the plurality of electrode frames 120a having the second penetration holes 155b penetrating through an inner portion thereof are connected to each other and are arranged in the array form, and the forming of the molding part 130a may include filling the second penetration holes 155b with the molding part 130a in order to enhance the bonding between the electrode frame 120a and the molding part 130a.

According to the chip-on-board type light emitting device package and the method for manufacturing the same of the present invention, a separate insulating layer does not need to be formed in order for the base frame 110a and the electrode frame 120a to be electrically spaced apart from each other. That is, the base frame 110a and the electrode frame 120a may be configured to be spaced apart from each other by only a process of forming the molding part 130a having the opening 141 through which the light generated in the light emitting devices is to be emitted. In addition, the base frame 110a and the electrode frame 120a may be spaced apart from each other by a molding process without forming a separate sacrificial layer interposed therebetween, such that a manufacturing cost may be reduced. Further, according to the method for manufacturing a chip-on-board type light emitting device package of the present invention, the transfer molding process may be applied, such that mass production may be easily performed, and the same process as a general package manufacturing process may be applied, such that productivity may be secured. Further, an injection-molding using the dual frame is applied, thereby making it possible to maximize heat capacity and heat-dissipating performance.

In addition, according to the chip-on-board type light emitting device package and the method for manufacturing the same of the present invention, the penetration hole 155 penetrating through the base frame 110a and/or the electrode frame 120a is formed and is filled with the molding part 130a to enhance the bonding between the base frame 110a and/or the electrode frame 120a and the molding part 130, thereby making it possible to improve mechanical stability of the chip-on-board type light emitting device package.

Although the present invention has been described with reference to exemplary embodiments illustrated in the accompanying drawings, it is only an example. It will be understood by those skilled in the art that various modifications and equivalent other exemplary embodiments are possible from the present invention. Accordingly, the actual technical protection scope of the present invention is to be defined by the following claims.

DESCRIPTION OF MAIN REFERENCE NUMERALS OF DRAWINGS

100: chip-on-board type light emitting device package
110a: base frame
120a: electrode frame
130a: molding part
105: alignment hole
141: opening
142, 143, 145: through-hole
155: penetration hole
155a: first penetration hole
155b: second penetration hole
242, 243, 245: support pin

The invention claimed is:

1. A chip-on-board type light emitting device package comprising:
a dual frame including a base frame on which a plurality of light emitting devices are mounted and an electrode frame positioned above the base frame so as to be spaced apart from the base frame and including two electrodes separated from each other; and
a molding part coupled to the dual frame so that the base frame and the electrode frame are spaced apart from each other and having an opening through which light generated in the plurality of light emitting devices is to be emitted,
wherein the base frame has a through-hole through which the electrode frame is exposed, and
wherein the molding part forms a side wall of the opening so as to expose a portion of the electrode frame, and is extended to be filled in an overlapped region between the electrode frame and the base frame.

2. The chip-on-board type light emitting device package of claim 1, wherein the molding part is further extended to cover at least a portion of a side wall of the through-hole.

3. The chip-on-board type light emitting device package of claim 1, wherein the molding part is formed directly below in a region in which a bonding wire electrically connecting the light emitting device and the electrode frame to each other is bonded to the electrode frame.

4. The chip-on-board type light emitting device package of claim 1, wherein the base frame has a first penetration hole penetrating through an inner portion thereof, the first penetration hole being filled with the molding part, such that bonding between the base frame and the molding part is enhanced.

5. The chip-on-board type light emitting device package of claim 4, wherein a cross section of the first penetration hole becomes wider toward a lower portion of the base frame.

6. The chip-on-board type light emitting device package of claim 4, wherein a ruggedness is formed on a contact portion between an upper surface of the base frame and the molding part, such that bonding between the base frame and the molding part is enhanced.

7. The chip-on-board type light emitting device package of claim 4, wherein the electrode frame has a second penetration hole formed at a position corresponding to the first penetration hole above the first penetration hole, the second penetration hole being filled with the molding part, such that bonding between the electrode frame and the molding part is enhanced.

8. A method for manufacturing a chip-on-board type light emitting device package, comprising:
providing a base frame structure in which a plurality of base frames on which a plurality of light emitting devices are mounted are connected to each other and are arranged in an array form;
providing an electrode frame structure in which a plurality of electrode frames are connected to each other and are arranged in an array form, the electrode frame structure being formed in a down-set structure;
providing a dual frame structure by aligning and disposing the electrode frame structure with and on the base frame structure; and
forming a molding part coupled to the dual frame structure so that the base frame and the electrode frame are spaced apart from each other and having an opening through which light generated in the plurality of light emitting devices is to be emitted,
wherein the base frame has a through-hole through which the electrode frame is exposed,
wherein the forming of the molding part includes inserting a support pin into the through-hole in order to prevent generation of a short-circuit due to a contact between the electrode frame and the base frame.

9. The method for manufacturing a chip-on-board type light emitting device package of claim 8, wherein the providing of the dual frame structure includes inserting guide pins into alignment holes formed in each of the base frame structure and the electrode frame structure.

10. The method for manufacturing a chip-on-board type light emitting device package of claim 8,
wherein the providing of the base frame structure includes providing the base frame structure in which the plurality of base frames having first penetration holes penetrating through an inner portion thereof are connected to each other and are arranged in the array form, and
the forming of the molding part includes filling the first penetration holes with the molding part in order to enhance bonding between the base frame and the molding part.

11. The method for manufacturing a chip-on-board type light emitting device package of claim 10,
wherein the providing of the electrode frame structure includes providing the electrode frame structure in which the plurality of electrode frames having second penetration holes penetrating through an inner portion thereof are connected to each other and are arranged in the array form, and
the forming of the molding part includes filling the second penetration holes with the molding part in order to enhance bonding between the electrode frame and the molding part.

* * * * *